(12) United States Patent
Nakasato et al.

(10) Patent No.: US 8,592,257 B2
(45) Date of Patent: Nov. 26, 2013

(54) METHOD FOR MANUFACTURING SEMICONDUCTOR MODULES

(75) Inventors: Mayumi Nakasato, Ogaki (JP); Kouichi Saitou, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 13/554,605

(22) Filed: Jul. 20, 2012

(65) Prior Publication Data

US 2012/0288999 A1    Nov. 15, 2012

Related U.S. Application Data

(63) Continuation of application No. PCT/JP2011/051101, filed on Jan. 21, 2011.

(30) Foreign Application Priority Data

Jan. 22, 2010    (JP) .................................. 2010-011759

(51) Int. Cl.
*H01L 21/00*    (2006.01)

(52) U.S. Cl.
USPC ........................................................ 438/113

(58) Field of Classification Search
None
See application file for complete search history.

(56) References Cited

U.S. PATENT DOCUMENTS

| | | | | |
|---|---|---|---|---|
| 7,960,719 | B2* | 6/2011 | Kato | 257/40 |
| 2011/0193222 | A1* | 8/2011 | Usui et al. | 257/737 |
| 2011/0293874 | A1* | 12/2011 | Toyooka et al. | 428/49 |

FOREIGN PATENT DOCUMENTS

| | | | |
|---|---|---|---|
| JP | 03-046253 | A | 2/1991 |
| JP | 2001-176898 | A | 6/2001 |
| JP | 2003-258157 | A | 9/2003 |
| JP | 2004-349361 | A | 12/2004 |
| JP | 2005-322858 | A | 11/2005 |
| JP | 2009-246174 | A | 10/2009 |
| JP | 2009-267409 | A | 11/2009 |

OTHER PUBLICATIONS

International Search Report, and English translation thereof, issued in International Patent Application No. PCT/JP2011/051101 dated Feb. 22, 2011.
International Preliminary Report on Patentability, and English translation thereof, issued in International Patent Application No. PCT/JP2011/051101 dated Jul. 31, 2012.

* cited by examiner

*Primary Examiner* — Charles Garber
*Assistant Examiner* — Andre' C Stevenson
(74) *Attorney, Agent, or Firm* — McDermott Will & Emery LLP

(57) ABSTRACT

A method for fabricating a semiconductor module includes: bonding a semiconductor substrate onto a first insulating resin layer; dicing the semiconductor substrate into a plurality of individual semiconductor devices; widening the spacings between the adjacent semiconductor devices by expanding the first insulating resin layer in a biaxially stretched manner; fixing the plurality of semiconductor devices to a flat sheet, with a second insulating resin layer held between the plurality of semiconductor devices and the flat sheet, and removing the first insulating resin layer; stacking the plurality of semiconductor devices, a third insulating resin layer, and a metallic plate, in this order, so as to form a laminated body having electrodes by which to electrically connect the device electrodes to the metallic plate; forming a wiring layer by selectively removing the metallic plate and forming a plurality of semiconductor modules; and separating the semiconductor modules into individual units.

2 Claims, 11 Drawing Sheets

METHOD FOR MANUFACTURING SEMICONDUCTOR MODULES

RELATED APPLICATIONS

This application is a continuation of PCT International Application PCT/JP2011/051101 filed on Jan. 21, 2011, which claims priority to Japanese Patent Application No. 2010-011759 filed on Jan. 22, 2010. The disclosures of these applications including the specifications, the drawings, and the claims are hereby incorporated by reference in their entirety.

BACKGROUND OF THE INVENTION

1. Field of the Invention

The present invention relates to a method for manufacturing semiconductor modules.

2. Description of the Related Art

Portable electronic devices, such as mobile phones, PDAs, DVCs and DSCs, are gaining increasing sophistication in functions and features. And to be accepted by the market, they have to be smaller in size and lighter in weight, and for the realization thereof, there is a growing demand for highly-integrated system LSIs. On the other hand, these electronic devices are desired to be easier or handier to use, and therefore the LSIs used in those devices are required to be more functionally sophisticated and better performing. For this reason, the higher integration of LSI chips is causing increases in I/O count (the number of inputs/outputs), which in turn generates demand for smaller packages. To satisfy both these requirements, it is strongly desired that semiconductor packages suited for the high board density packaging of semiconductor components be developed. To meet such needs, a variety of packaging technologies called CSP (Chip Size Package) are being developed.

A method of manufacturing semiconductor modules of such a CSP type has been proposed as follows as a method to reduce the number of processes. In other words, this conventional method is such that semiconductor constructions having external connection electrodes are first arranged on a base plate in such a manner as to be mutually apart slightly from each other, and an insulating layer is formed in a periphery-side surface of the semiconductor constructions. Then, the semiconductor constructions and the insulating layer are covered with an insulating film, and a metallic sheet (metallic plate) having bump electrodes is disposed on the insulating film. Then, the bump electrodes are connected to the external connection electrodes by having the bump electrodes bite into the insulating film. After this, a rewiring is formed by patterning the metallic sheet, thereby completing the fabrication of the semiconductor module.

In the above-described method for manufacturing the CSP-type semiconductor modules, a semiconductor wafer on which a plurality of semiconductor devices are formed are diced into pieces with the semiconductor wafer fixed firmly to a dicing tape or the like. Those divided into individual semiconductor devices by the dicing are separated one by one from the dicing tape with the result that those separated are arranged on the base plate serving as a support in such a manner that they are mutually apart slightly from each other. This is how semiconductor modules are formed.

Also known is a wafer expansion unit, so-called an expanding apparatus, which is used to separate the individual semiconductor devices from the dicing tape. The wafer expansion unit expands a wafer fixed to a wafer sheet in such a manner that the wafer sheet (dicing tape), to which the diced wafers are fixed, is clamped and set on an upthrust table (collet type) and thereby the wafer sheet is thrust upward. Expanding the wafer provides a gap (space) between adjacent semiconductor devices, so that each semiconductor device can be easily separated from the dicing tape.

As described above, in the conventional method for manufacturing the CSP-type semiconductor modules, the individual semiconductor devices are separated one by one from the dicing tape with the result that those separated are arranged on the base plate serving as a support in such a manner that they are mutually apart slightly from each other. This is how semiconductor modules are formed. Accordingly, it takes time to arrangement the semiconductor devices, thus causing a drop in production efficiency of semiconductor modules.

SUMMARY OF THE INVENTION

The present invention has been made in view of the foregoing problems, and a purpose thereof is to provide a technology for improving the production efficiency of semiconductor modules in a method for fabricating CSP-type semiconductor modules.

In order to resolve the above problems, an embodiment of the present invention relates to a method for fabricating a semiconductor module. The method includes: bonding a semiconductor substrate onto a first insulating resin layer having an expansibility in a manner such that one main surface of the semiconductor substrate is in contact with the first insulating resin layer, the semiconductor substrate having a plurality of semiconductor devices formed therein, each of the semiconductor devices having device electrodes provided on the one main surface thereof; dicing the semiconductor substrate into a plurality of individual semiconductor devices; widening spacings between adjacent semiconductor devices by expanding the first insulating resin layer in a biaxially stretched manner; placing a second insulating resin layer and a flat sheet at a side of the other main surface of the plurality of semiconductor devices, fixing the plurality of semiconductor devices to the flat sheet with the second insulating resin layer held between the plurality of semiconductor devices and the flat sheet, and removing the first insulating resin layer, while the first insulating resin layer is being expanded; stacking the plurality of semiconductor devices fixed to the flat sheet with the second insulating resin layer held therebetween, a third insulating resin layer, and a metallic sheet, in this order, so as to form a laminated body having electrodes by which to electrically connect the device electrodes of each of the semiconductor devices to the metallic sheet; forming a wiring layer corresponding to each of the semiconductor devices by selectively removing the metallic sheet, and forming a plurality of semiconductor modules joined with each other by the flat sheet, the second insulating resin layer and the third insulating resin layer; and separating the semiconductor modules into individual units by cutting the second insulating resin layer and the third insulating resin layer and removing the flat sheet from the second insulating resin layer in random order.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

Figure 1:
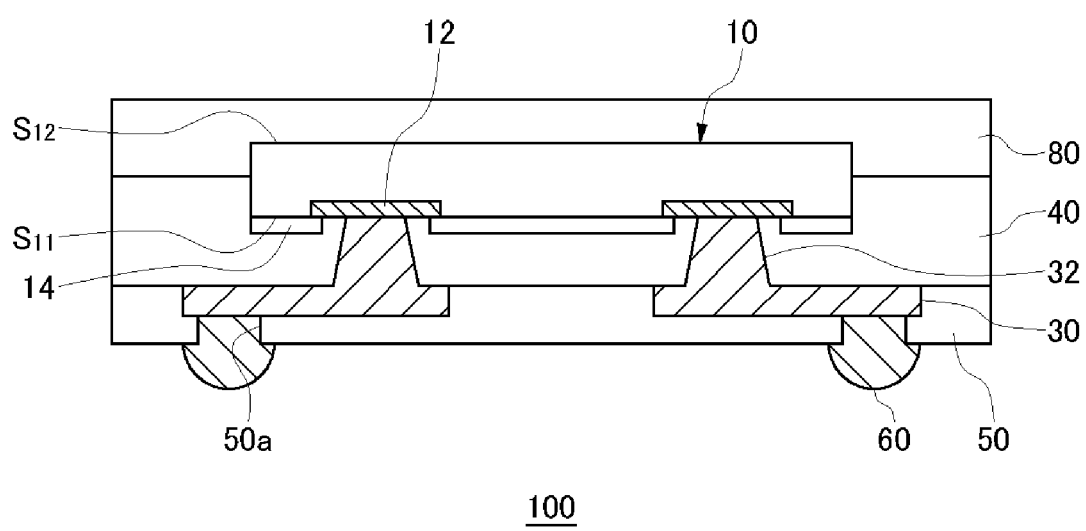
FIG. 1 is a schematic cross-sectional view showing a structure of a semiconductor module according to a first embodiment.

Hereinafter, the present invention will be described based on preferred embodiments with reference to the accompanying drawings. The same or equivalent constituents, members, or processes illustrated in each drawing will be denoted with the same reference numerals, and the repeated description thereof will be omitted as appropriate. The preferred embodiments do not intend to limit the scope of the invention but exemplify the invention. All of the features and the combinations thereof described in the embodiments are not necessarily essential to the invention.

First Embodiment

FIG. 1 is a schematic cross-sectional view showing a structure of a semiconductor module 100 according to a first embodiment. The semiconductor module 100 includes, as principal components, a semiconductor device 10, a third insulating resin layer 40, a wiring layer 30, a second insulating resin layer 80, a protective layer 50, and external electrodes 60.

The semiconductor device 10 has device electrodes 12 on one of main surfaces $S_{11}$ thereof. Also, the semiconductor device 10 has a device protective layer 14 laminated on the main surface $S_{11}$. In the device protective layer 14, openings are provided so that the device electrodes 12 can be exposed from the openings. A specific example of the semiconductor device 10 is a semiconductor chip such as an integrated circuit (IC) or a large-scale integrated circuit (LSI). A specific example of the protective layer 14 is a polyimide layer or the like. For example, aluminum (Al) is used as the device electrode 12. A part of the semiconductor device 10 excluding the device protective layer 14 (namely, silicon part) is about 250 μm in thickness, for instance, whereas the thickness of the device protective layer 14 is about 3 μm, for instance.

On the main surface $S_{11}$ side of the semiconductor device 10, the third insulating resin layer 40 is provided. The third insulating resin layer 40 is made of an insulating resin and is formed of, for example, a material that develops plastic flow when pressurized. An example of the material that develops plastic flow when pressurized is epoxy-based thermosetting resin. The epoxy-based thermosetting resin to be used for the third insulating resin layer 40 may be, for example, one having viscosity of 1 kPa·s under the conditions of a temperature of 160° C. and a pressure of 8 MPa. If a pressure of about 5 to 15 MPa is applied to this epoxy-based thermosetting resin at a temperature of 160° C., then the viscosity of the resin will drop to about ⅛ of the viscosity thereof with no pressurization. The thickness of the third insulating resin layer 40 is about 30 μm, for instance.

The wiring layer 30 is disposed on a main surface of the third insulating resin layer 40 opposite to the semiconductor device 10. The wiring layer 30 is formed of a conductive material, preferably of a rolled metal or more preferably of a rolled copper. Or the wiring layer 30 may be formed of electrolyte copper or the like. Electrodes 32 corresponding respectively to the device electrodes 12 are provided on a face of the wiring layer 30 at a third insulating resin layer 40 side. The electrode 32 according to the present embodiment is a bump electrode that is electrically connected to the wiring layer 30. It is preferable that the wiring layer 30 and the electrode 32 be formed integrally with each other. Such a structure prevents the occurrence of cracks or the like due to the heat stress occurring at an interface between the wiring layer 30 and the electrode 32. Also, the connection between the wiring layer 30 and the electrode 32 is assured as compared when they are each a separate item. Moreover, the device electrode 12 and the wiring layer 30 are electrically connected simultaneously when the electrode 32 and the device electrode 12 are connected, and therefore another advantageous effect of not increasing the number of processes is achieved. A land area where the external connection electrode 60 (discussed later) is disposed is formed in an end region on a surface of the wiring layer 30 opposite to the electrode 32. The thickness of the wiring layer 30 is about 20 μm, for instance. The diameter of the base, the diameter of the top, and the height of the electrode 32 are about 40 μmφ, about 30 μmφ, and about 20 μmφ, respectively.

The protective layer 50 is provided on a main surface of the wiring layer 30 opposite to the third insulating resin layer 40. This protective layer 50 protects the wiring layer 30 against oxidation or the like. The protective layer 50 may be a solder resist layer, for instance. An opening 50a is formed in a predetermined position of the protective layer 50 corresponding to the land area of the wiring layer 30, and the land area of the wiring layer 30 is exposed by the opening 50a. The external connection electrode 60, such as a solder ball, is provided within the opening 50a. And the external connection electrode 60 and the wiring layer 30 are electrically connected to each other. The position in which the external connection electrode 60 is formed, namely, the area in which the opening 50a is formed is, for instance, a targeted end region where circuit wiring is extended through a rewiring. The thickness of the protective layer 50 is about 30 μm, for instance.

The second insulating resin layer 80 is provided on the other main surface $S_{12}$ side of the semiconductor device 10. The second insulating resin layer 80 is made of an insulating resin such as an epoxy-based thermosetting resin. The thickness of the second insulating resin layer 80 is about 250 μm, for instance.

While the second insulating resin layer 80, the semiconductor device 10, the third insulating resin layer 40 and the wiring layer 30 are stacked in this order and united into one body, the second insulating resin layer 80 and the third insulating resin layer 40 are in contact with each other in areas lateral to the semiconductor device 10. That is, the interface between the second insulating resin layer 80 and the third insulating resin layer 40 is in contact with the side surface of the semiconductor device 10. Thus, the sides of the semiconductor device 10 are covered with the second insulating resin layer 80 and the third insulating resin layer 40. As a result, the second insulating resin layer 80 and the semiconductor device 10 are least likely to break away from each other and, at the same time, the third insulating resin layer 40 and the semiconductor device 10 are also least likely to break away from each other.

(Method for Fabricating a Semiconductor Module)

FIGS. 2A to 2C and FIGS. 3A to 3C are cross-sectional views showing a process in a method for dicing a semiconductor wafer into a plurality of individual semiconductor devices. In each Figure, (i) is a plan view and (ii) is a cross-sectional view taken along the line A-A of (i). In (i) of each Figure, the device electrode 12 shown in (ii) is omitted.

Figure 2A:
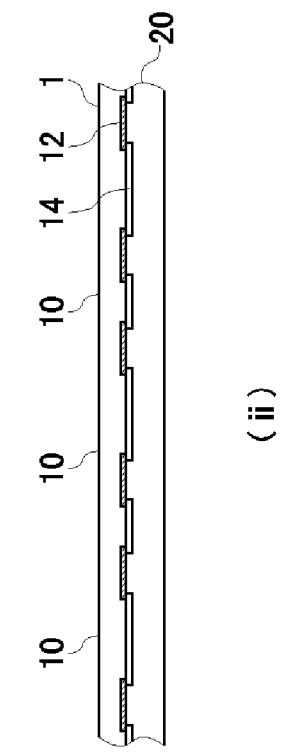
FIGS. 2A to 2C are cross-sectional views showing a process in a method for dicing a semiconductor wafer into a plurality of individual semiconductor devices.

As illustrated in FIG. 2A, prepared first is a semiconductor wafer 1 as a semiconductor substrate where a plurality of semiconductor devices 10 each provided with device electrodes 12 disposed on one main surface thereof are formed and arranged in a matrix shape. More specifically, for example, the semiconductor devices 10, such as predetermined integrated circuits, are formed on the surface of the semiconductor wafer 1, such as a p-type silicon substrate, by a known technique; also, device electrodes 12 are formed in the peripheral or top part of each semiconductor device 10. The protective layer 14 used to protect the semiconductor device 10 is formed on an area of the surface of the semiconductor device 10 except the surfaces of the device electrodes 12. The semiconductor devices 10 are demarcated by a plurality of not-shown scribe lines.

The thus prepared semiconductor wafer 1 is bonded onto a first insulating resin layer 20 having an expansibility. At this time, the semiconductor wafer 1 is bonded onto the first insulating resin layer 20 so that one main surface of the semiconductor wafer 1 where the device electrodes 12 are provided is in contact with the first insulating resin layer 20. An adhesive is applied to the one main surface of the first insulating resin layer 20 on a side where the semiconductor wafer 1 is placed, and the semiconductor wafer 1 is bonded onto the first insulating resin layer 20 by the adhesive power of the adhesive. In the present embodiment, a material having an expansibility, such as vinyl chloride resin or polyolefin-based resin, is used as the first insulating resin layer 20. The thickness of the first insulating resin layer 20 is about 100 μm, for instance.

Figure 2B:
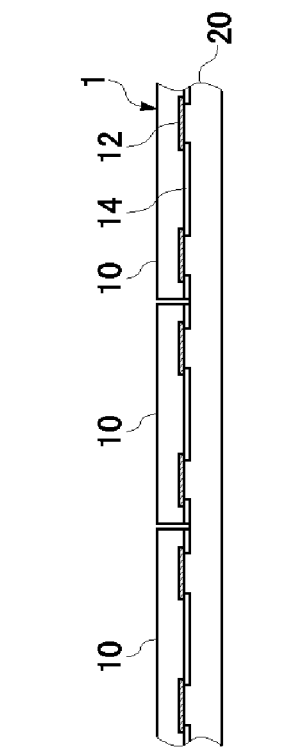

Then, as illustrated in FIG. 2B, the semiconductor wafer 1 is diced into a plurality of individual semiconductor devices 10. In the dicing of the semiconductor wafer 1, the semiconductor wafer 1 is cut along not-shown scribe lines demarcating the plurality of semiconductor devices 10, by use of a known dicing apparatus. Each semiconductor device 10 is of an approximately square shape with the side length of about 5 mm (approximately quadrangle in shape in a plan view), for instance.

Figure 2C:
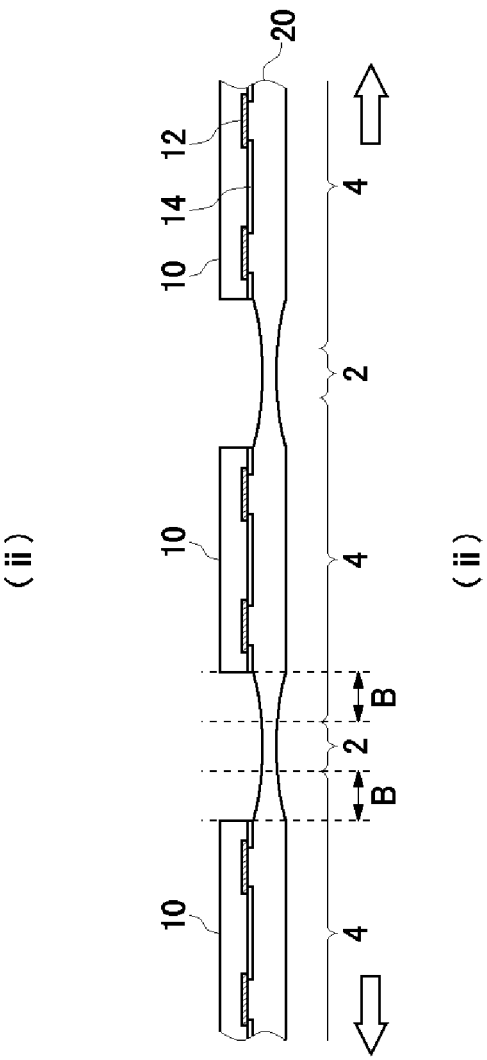

Then, as illustrated in FIG. 2C, the first insulating resin layer 20 is expanded in a biaxially stretched manner so as to widen the spacing between the adjacent semiconductor devices 10. The four sides of the first insulating resin layer 20 are gripped by a plurality of chucks 200 of a biaxial film stretcher wherein the chucks 200 are spaced apart at predetermined intervals. Then the first insulating resin layer 20 are stretched in the X-axis and Y-axis directions by driving the biaxial film stretcher. The amount of expansion of the first insulating resin layer 20 is such that this interval between every two adjacent semiconductor devices 10 equals, for example, the sum of the width of a dicing line 2, along which the semiconductor modules 100 (described later) are cut into individual units, and two areas B lateral to each semiconductor device 10 in a formed region 4 of each semiconductor module 100. More specifically, the interval is about 1 to 5 mm. It is preferred that the stretching directions (X-axis direction and Y-axis direction) of the first insulating resin layer 20 agree with the dicing directions (directions along which the semiconductor devices 10 are aligned) of the semiconductor wafer 1. In this case, the distance between every two adjacent semiconductor devices 10 can be made uniform more accurately.

Expanding the first insulating resin layer 20 in a biaxially stretched manner allows the first insulating resin layer 20 to be expanded evenly and uniformly. Accordingly, the semiconductor wafer 1 can be stretched evenly while the alignment properties of the respective semiconductor devices 10 in the X-axis direction and the Y-axis direction are kept intact. Thus, the interval between every two adjacent semiconductor devices 10 is made substantially uniform. As a result, the device electrode 12 and the electrode 32 can be reliably connected with each other, irrespective of the position of the semiconductor device 10 on the first insulating resin layer 20. Hence, the production yield of semiconductor modules 100 can be raised.

Figure 3A:
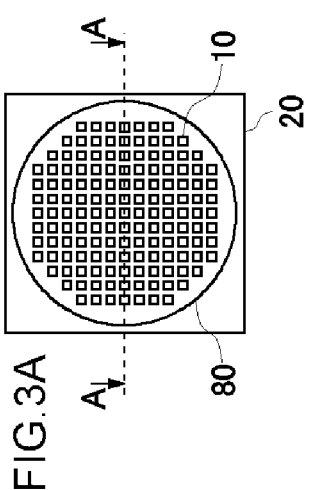
FIGS. 3A to 3C are cross-sectional views showing a process in a method for dicing a semiconductor wafer into a plurality of individual semiconductor devices.
Figure 3A:
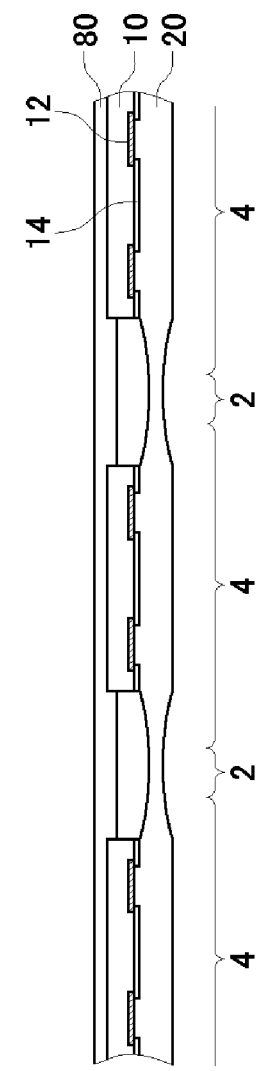

Then, as illustrated in FIG. 3A, the second insulating resin layer 80 is stacked on the other main surface of the semiconductor device 10, namely, on a main surface of the semiconductor device 10 opposite to a side where the semiconductor device 10 is in contact with the first insulating resin layer 20. The second insulating resin layer 80 is so provided as to cover the other main surface of the semiconductor device 10 and a part of side surfaces of the semiconductor device 10 in contact with the other main surface thereof. The second insulating resin layer 80 may be formed by applying a resin dissolved with solvent or applying monomer before polymetrization. As another example, the second insulating resin 80 may be formed by heating and pressurizing a film-like resin.

Figure 3B:
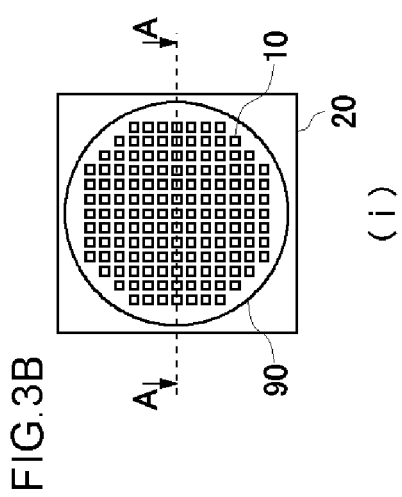
Figure 3B:
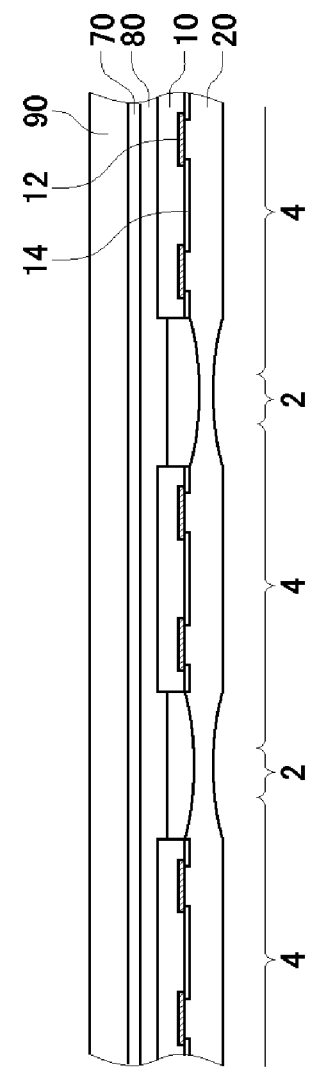

Then, as illustrated in FIG. 3B, with the first insulating resin layer 20 being expanded, a flat sheet 90 on which a fourth insulating resin layer 70 has been stacked is placed on the other main surface side of the semiconductor device 10, and the flat sheet 90 is bonded to the second insulating resin layer 80 with the fourth insulating resin layer 70 held between the flat sheet 90 and the second insulating resin layer 80. Thereby, a plurality of semiconductor devices 10 are fixed to the flat sheet 90 with the second insulating resin layer 80 disposed between the semiconductor devices 10 and the flat sheet 90. The fourth insulating resin layer 70 is made of a resin having the adhesive properties and having a thermosetting temperature enough to suppress the hardening of the resin itself due to the heat produced in a fabrication process up to an exfoliation (flaking-off) process of the flat sheet 90. Note that the exfoliation (flaking-off) process may also be hereinafter referred to as "separation process". This prevents the events where, in the fabrication process up to the separation process of the flat sheet 90, at least part of the fourth insulating resin layer 70 becomes thermally hardened, thereby the adhesion power thereof drops, and therefore the flat sheet 90 is peeled off. It should be noted here that the fourth insulating resin layer 70 also has the following properties. That is, if the fourth insulating resin layer 70 gets hardened in a process of exfoliating the flat sheet 90 with the result that the adhesion power drops, the fourth insulating resin layer 70 will function to separate the flat sheet 90 from the second insulating resin layer 80. Such a resin as described above may be acrylic or silicon-based adhesive, for instance. Note also that the fourth insulating adhesive layer 70 may be a film coated with ultraviolet-cured resin on both sides. In such a case, too, irradiating the fourth insulating resin layer 70 with the ultraviolet light functions to separate the flat sheet 90 from the second insulating resin layer 80 similarly to the case of the aforementioned thermosetting resin. Hence, the flat sheet 90 can be easily separated.

The flat sheet 90 may be a glass sheet, and the thickness thereof is about 0.5 μm, for instance. Since the flat sheet 90 is a glass sheet, the composition thereof is similar to the semiconductor device 10 which is made of silicon. Accordingly, a difference in thermal expansion coefficients between the flat sheet 90 and the semiconductor device 10 is smaller than that between the second insulating resin layer 80 and the semiconductor device 10. As described above, the second insulating resin layer 80 is held between the semiconductor device 10 and the flat sheet 90 whose difference in thermal expansion coefficients therebetween is smaller. This helps prevent the separation, between the semiconductor device 10 and the second insulating resin layer 80, which may be caused by the difference in thermal expansion coefficients and which may occur when the semiconductor device 10 and/or the second insulating resin layer 80 are/is heated in successive processes.

Figure 3C:
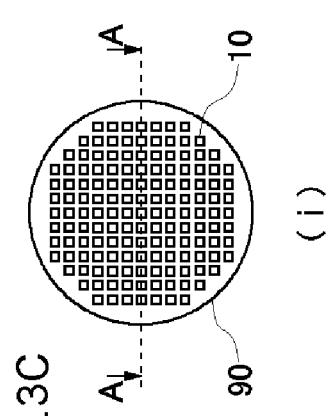
Figure 3C:
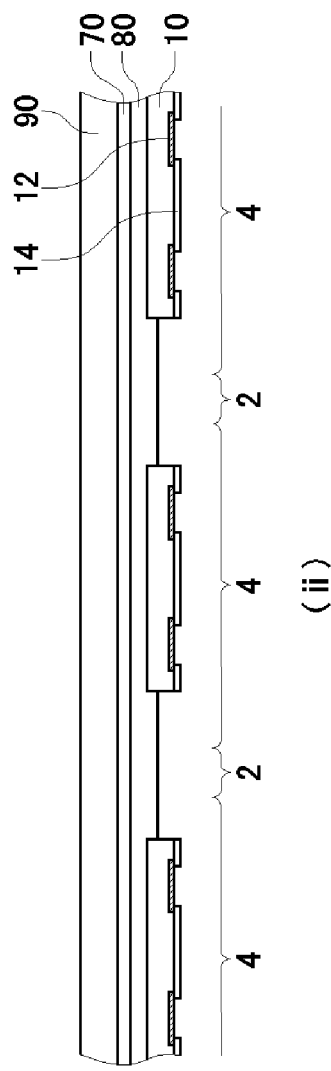

Then, as illustrated in FIG. 3C, the first insulating resin layer 20 is removed.

FIGS. 4A to 4F are cross-sectional views showing a process in a method for forming electrodes. In the present embodiment, a description is given of an example where the electrodes 32 are bump electrodes.

Figure 4A:
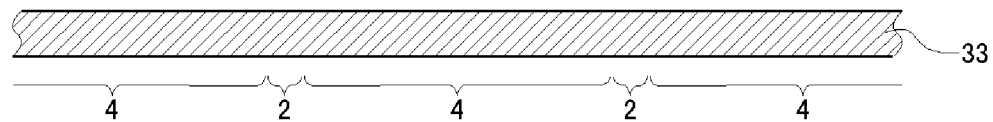
FIGS. 4A to 4F are cross-sectional views showing a process in a method for forming electrodes.

As illustrated in FIG. 4A, a copper sheet 33 is first prepared as a metallic sheet having a thickness greater than at least the sum of the height of the electrode 32 and the thickness of the wiring layer 30.

Figure 4B:
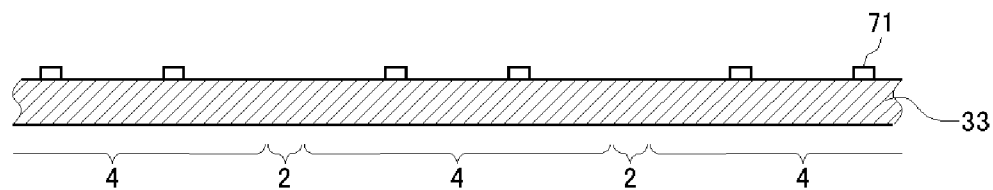

Then, as illustrated in FIG. 4B, resists 71 are formed selectively in alignment with a pattern of electrodes 32 using a photolithography method. More specifically, a resist film of predetermined film thickness is affixed to the copper sheet 33 by a laminating apparatus, and it is then subjected to exposure by the use of a photo mask having the pattern of electrodes 32. After this, the resists 71 are selectively formed on the copper sheet 33 by a development. To improve the adhesion of the resists 71 to the copper sheet 33, it is desirable that a pretreatment, such as grinding, cleaning and the like, be performed as necessary on the surface of the copper sheet 33 before the lamination of the resist film thereon.

Figure 4C:
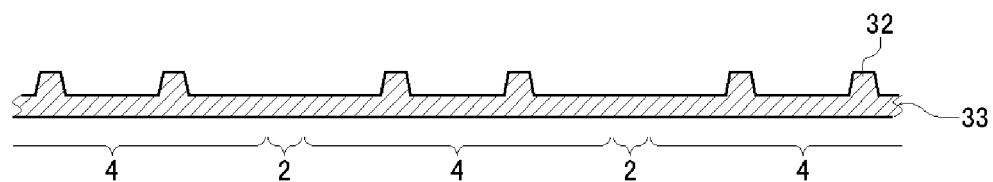

Then, as illustrated in FIG. 4C, the electrodes 32 having a predetermined pattern are formed on the copper sheet 33 using the resists 71 as a mask. More concretely, the electrodes 32 having a predetermined pattern are formed by performing a wet etching on the copper sheet 33, in which a chemical such as ferric chloride solution or the like is used, using the resists 71 as a mask. After the formation of the electrodes 32, the resists 71 are removed using a remover. The positions of the electrodes 32 correspond respectively to the positions of the device electrodes 12 of each semiconductor device 10 where the interval between the adjacent semiconductors 10 is widened as a result of expansion of the first insulating resin layer 20.

Figure 4D:
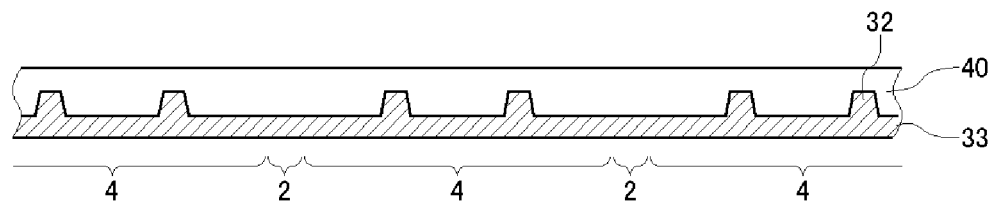

Then, as illustrated in FIG. 4D, a third insulating resin layer 40 is stacked on a main surface of the copper sheet 33 on the side where the electrodes 32 are formed in such a manner as to cover the electrodes 32.

Figure 4E:
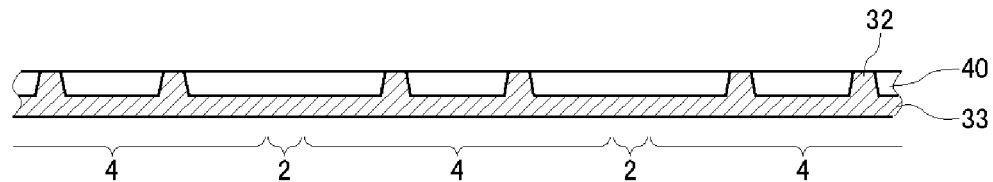

Then, as illustrated in FIG. 4E, the heads of the electrodes 32 are exposed by removing a predetermined amount of the third insulating resin layer 40 by performing an ashing using $O_2$ plasma or the like on the main surface of the third insulating resin layer 40, thereby allowing the electrodes 32 to penetrate the third insulating resin layer 40.

Figure 4F:
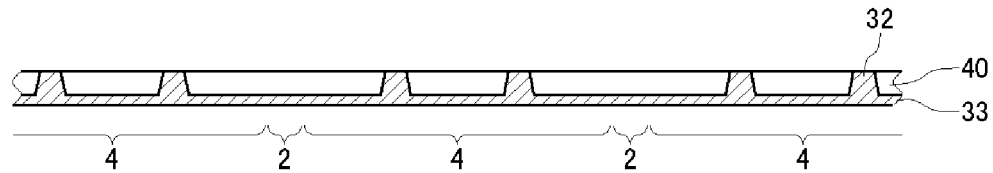

Then, as shown in FIG. 4F, the surface of the copper sheet 33 on a side opposite to the side where the electrodes 32 are provided is etched back using a chemical such as ferric chloride solution, and the copper sheet 33 is turned into thin film thereby. At this time, a resist protective film (not shown) is formed on the third insulating resin layer 40 in such a manner as to cover the electrodes 32 in order to protect the electrodes 32, and this resist protective film is removed after the etching. As a result, the copper sheet 33 is so processed as to have the thickness of the wiring layer 30. The electrodes 32 are now integrally formed with the copper sheet 33 through a process as described above. Also, formed through the process as described above is the copper sheet 33 where the third insulating resin layer 40 is laminated on the main surface side on which the electrodes 32 are formed.

FIGS. 5A to 5C and FIGS. 6A to 6C are cross-sectional views showing a process in a method for forming a wiring layer and connecting the electrodes to the device electrodes.

Figure 5A:
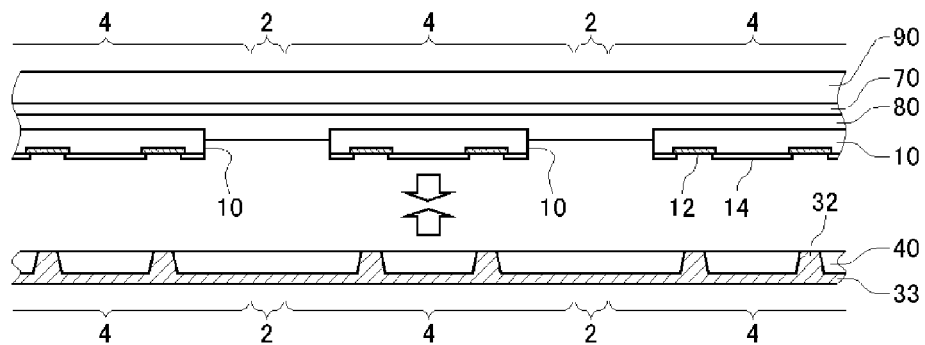
FIGS. 5A to 5C are cross-sectional views showing a process in a method for forming a wiring layer and connecting electrodes to device electrodes.

As illustrated in FIG. 5A, the copper sheet 33, on which the third insulating resin layer 40 is stacked, is first positioned such that the electrodes 32 face the semiconductor devices 10. Then the thus positioned copper sheet 33 is bonded to a plurality of semiconductor devices 10 fixed to the flat sheet 90, using a press machine. The pressure and temperature to be employed at the time when the copper sheet 33 and the semiconductor devices 10 are bonded together are about 5 MPa and about 200° C., respectively, for instance. As a result, the electrodes 32 and the device electrodes 12 are electrically coupled with each other. Also, the second insulating resin layer 80 is thermally cured due to the heat applied at the time when the copper sheet 33 and the semiconductor devices 10 are pasted together, and the semiconductor devices 10 are fixed to the second insulating resin layer 80. Also, the heat and pressure applied at the time when the copper sheet 33 and the semiconductor devices 10 are pasted together causes the third insulating resin layer 40 to develop plastic flow and thereby the second insulating resin layer 80 and the third insulating resin layer 40 are press-bonded together.

Figure 5B:
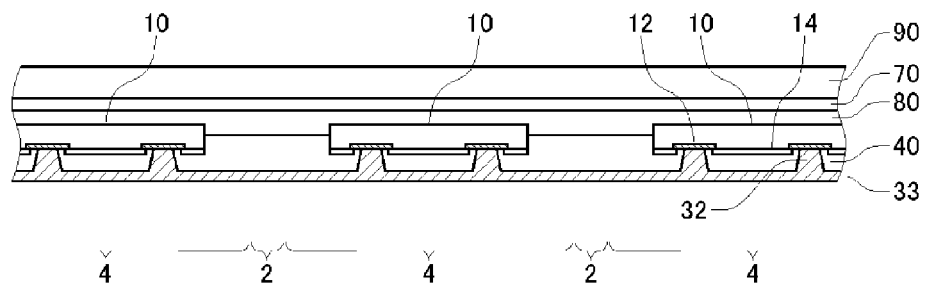

As a result, as illustrated in FIG. 5B, the plurality of semiconductor devices 10 fixed to the flat sheet 90 with the second insulating resin layer 80 interposed therebetween, the third insulating resin layer 40, and the copper sheet 33 are stacked in this order. This forms a laminated body having the electrodes 32 used to electrically connect the device electrodes 12 to the copper sheet 33.

Figure 5C:
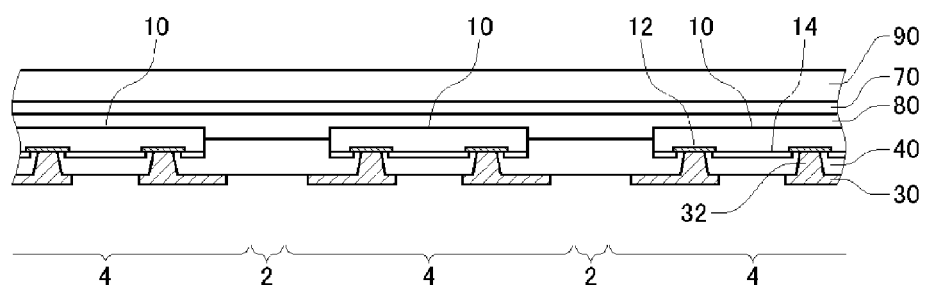

Then, not-shown resists are formed selectively in alignment with a pattern of wiring layers 30 on the main surface of the copper sheet 33, which is on the side opposite to the third insulating resin layer 40, using a photolithography method. Then the copper sheet 33 is selectively removed by performing a wet etching or the like thereon using these resists as a mask. As illustrated in FIG. 5C, this forms the wirings layers 30 of a predetermined pattern corresponding to the respective semiconductor devices 10. After that, the resists are removed.

Figure 6A:
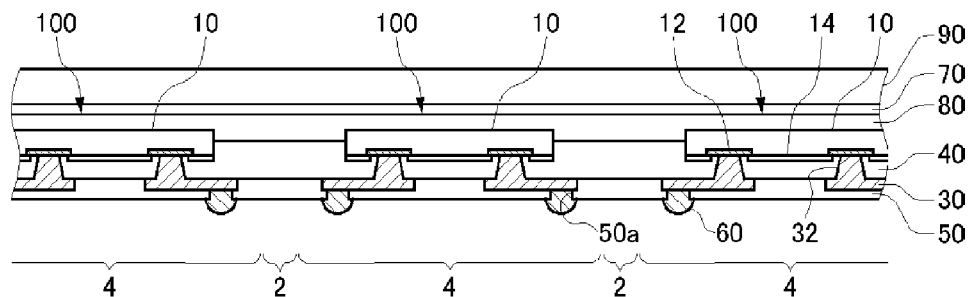
FIGS. 6A to 6C are cross-sectional views showing a process in a method for forming a wiring layer and connecting electrodes to device electrodes.

Then, as illustrated in FIG. 6A, the protective layer 50, which has openings 50a in regions corresponding to the positions for the formation of external connection electrodes 60, is stacked on the third insulating resin layer 40 in such a manner as to cover the wiring layers 30. Then the external connection electrodes 60 are formed within the openings 50a. Thereby, a plurality of semiconductor modules 100 joined with each other by the flat sheet 90, the second insulating resin layer 80, the third insulating resin layer 40 and the protective layer 50 are formed.

Figure 6B:
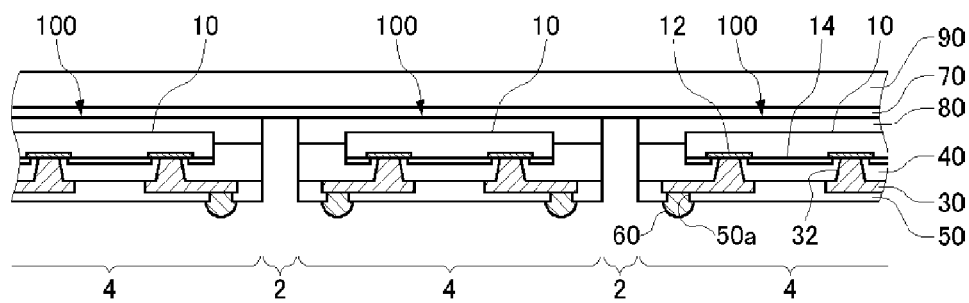

Then, as illustrated in FIG. 6B, the laminated body is diced along the scribe lines 2 so as to cut the third insulating resin layer 40, the second insulating resin layer 80 and the protective layer 50.

Figure 6C:
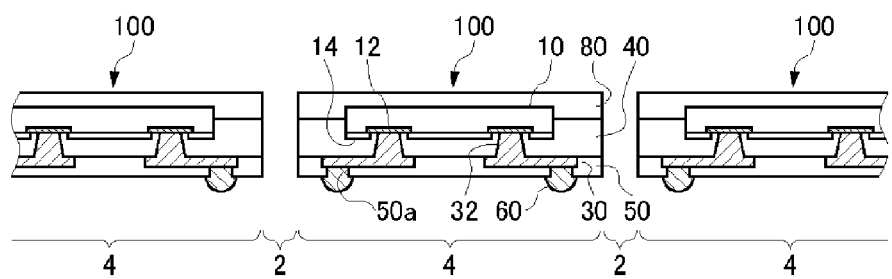

Then, as illustrated in FIG. 6C, the flat sheet 90 is removed from the second insulating resin layer 80 of each semiconductor module 100 with the result that a plurality of semiconductor modules 100 are completely separated from each other. The flat sheet may be removed therefrom as follows. That is, for example, many through-holes are formed in the flat sheet 90, and solvent is poured down through the through-holes. This removes the fourth insulating layer 70 and therefore removes the flat sheet 90. The semiconductor modules 100 are manufactured through processes as described above.

(Stretch Performance Test)

To compare the film stretching performance of the biaxial film stretcher with that of the conventional expanding apparatus, the two sets of film corresponding to the first insulating resin layer 20 are expanded by the biaxial film stretcher and the conventional expanding apparatus, respectively. The results of the film stretching performance were compared with each other. More specifically, a 6-inch Si wafer whose thickness is 625 μm is bonded onto a dicing film, made of polyvinyl chloride, whose thickness is 80 μm, and then the Si wafer is diced into a plurality of small pieces of wafer each of which is of an approximately square shape with the side length of about 5 mm. Then, the film is preheated for 15 minutes. Then, it is stretched by the biaxial film stretcher at an ambient temperature of 60° C. and at a draw rate (stretch rate) of 1 mm/minute until a square area of 170 mm becomes a square area of 250 mm.

On the other hand, a wafer expander (Model No. HS-1810-8) manufactured by Hugle Electronics Inc. was used as the conventional expanding apparatus. The film is preheated for 15 seconds. Then, it is stretched by the expander HS-1810-8 at a stage temperature of 55° C. and at the stage movement rate of 10 scales until the stage stroke becomes 90 mm. Then, with the center of the wafer as (0, 0), the distance between adjacent semiconductor devices at the coordinate points of (0, 14), (0, 7), (0, 0), (0, −7) and (0, −14) are measured in the X-axis direction and the Y-axis direction.

Each coordinate point is a position of an intersection point of a dicing line extending in the X-axis direction (X-direction dicing line) and a dicing line extending in the Y-axis direction (Y-direction dicing line). The X-direction dicing line passing through the center of the wafer is defined as an X-axis reference dicing line, whereas the Y-direction dicing line passing through the center of the wafer is defined as a Y-axis reference dicing line. And the absolute values of two sets of coordinate components at each coordinate point indicate how far the dicing line passing through each coordinate point is located from each reference dicing line. In other words, the absolute values thereof indicate the count of dicing lines from each reference dicing line for a given dicing line passing through each coordinate point. For example, the X-coordinate of a coordinate point that the X-axis reference dicing line passes through is "0". Also, an X-direction dicing line adjacent to the X-axis reference dicing line is the first X-direction dicing line counted from the X-axis reference dicing line, and the absolute value of the X-coordinate of a coordinate point that this X-direction dicing line passes through is "1". The coordinates (0, 7) indicates that its location is the intersection point of the X-axis reference dicing line and the seventh Y-direction dicing line counted from the Y-axis reference dicing line.

Also, the distance between adjacent semiconductor devices at each coordinate point is calculated such that the X-axis direction separation distances and the Y-axis direction separation distances among the four semiconductor devices 10 surrounding each coordinate point are averaged. It should noted here that the method for calculating the distance between adjacent semiconductor devices in each coordinate point is not limited thereto, and other methods may be employed. The other method may include a method where the X-axis direction separation distances and the Y-axis direction separation distances among the four semiconductor devices 10 surrounding an arbitrary coordinate point are averaged. The following table 1A shows the distances between the adjacent semiconductor devices where the first insulating resin layer 20 is expanded using the biaxial film stretcher. And the table 1B shows the distances between the adjacent semiconductor devices where the first insulating resin layer 20 is expanded using the conventional expanding apparatus.

TABLE 1A

BIAXIAL FILM STRETCHER

| THE COORDINATES (X, Y) | DISTANCE (mm) | |
|---|---|---|
| | X-AXIS DIRECTION | Y-AXIS DIRECTION |
| (0, 14) | 1.28 | 1.01 |
| (0, 7) | 1.46 | 1.08 |
| (0, 0) | 1.43 | 1.16 |
| (0, −7) | 1.37 | 1.11 |
| (0, −14) | 1.41 | 1.15 |

TABLE 1B

EXPANDING APPARATUS

| THE COORDINATES (X, Y) | DISTANCE (mm) | |
|---|---|---|
| | X-AXIS DIRECTION | Y-AXIS DIRECTION |
| (0, 14) | 0.98 | 0.11 |
| (0, 7) | 1.25 | 1.12 |
| (0, 0) | 1.83 | 1.81 |
| (0, −7) | 1.18 | 1.22 |
| (0, −14) | 1.00 | 0.09 |

A result using the biaxial film stretcher is compared against a result obtained when a wafer sheet is thrust upward so as to expand the distance between every adjacent semiconductor. As evident from the table 1A, the distance between adjacent semiconductor devices at each coordinate point is uniform in the case when the biaxial film stretcher is used. In contrast thereto, as evident from the table 1B, the distance therebetween is larger as the semiconductor device is located closer to the center of the wafer, in the case when the conventional expanding apparatus is used. This shows that, where the conventional expanding apparatus is used, the center of the first insulating resin layer 20 is more stretched than the peripheral area thereof. Although, for both the biaxial film stretcher and the conventional expanding apparatus, the distance therebetween in the X-axis direction is larger than that in the Y-axis direction at each point, this may be caused due to the characteristics of the dicing film itself.

As described above, in the method for fabricating the semiconductor modules 100 according to the present embodiment, the semiconductor wafer 1 is bonded onto the first insulating resin layer 20 so that the device electrodes 12 are in contact with the first insulating resin layer 20. And the first insulating resin layer 20 is expanded in a biaxially stretched manner after the semiconductor wafer 1 has been cut. Then, with the first insulating resin layer 20 being expanded, each semiconductor device 10 is fixed to the flat sheet 90 with the second insulating resin layer 80 disposed between the semiconductor device 10 and the flat sheet 90, and a plurality of semiconductor devices 10 fixed to the flat sheet 90 are bonded to the copper sheet 33. Thus, the structure and method implemented in the present embodiment eliminates the process in which the semiconductor devices 10 diced into individual ones are separated one by one and then those separated ones are again arranged in such a manner that they are mutually apart at a predetermined interval from each other. As a result, the manufacturing time of semiconductor modules 100 is reduced. Hence, the manufacturing efficiency of semiconductor modules 100 can be enhanced and moreover the manufacturing cost for semiconductor modules 100 can be reduced.

Also, the first insulating resin layer 20 is expanded in a biaxially stretched manner. Accordingly, the distances between every adjacent semiconductor devices 10 can be made uniform as compared with the case where the first insulating resin layer 20 is expanded by the conventional expanding apparatus. Thus, the device electrode 12 and the electrode 32 in each semiconductor device 10 can be reliably connected to each other, thereby improving the manufacturing yield of the semiconductor modules 100

Also, a glass sheet, the material of which is similar to that of the semiconductor device 10, is used for the flat sheet 90. This can prevent the separation, between the semiconductor device 10 and the third insulating resin layer 40, which may be caused by the difference in thermal expansion coefficients and which may occur when the semiconductor device 10 and/or the third insulating resin layer 40 and/is heated in the fabrication processes.

Also, since the spacing between every adjacent semiconductor devices 10 is widened, the range of area where the external connection electrodes can possibly be placed in each semiconductor device 10 can be enlarged. Thus, the total number of external connection electrodes 60 which can be formed in the placement area is increased, so that the demand for the increased number of I/O pins in the semiconductor device 10 can be met.

Also, the copper sheet 33 and the semiconductor devices 10 are bonded together in a state where the electrode 32 is exposed from the third insulating resin layer 40. As a result, the copper sheet 33 and the semiconductor devices 10 can be accurately positioned when they are bonded together. Accordingly, the connection reliability between the electrode 32 and the device electrode 12 improves.

Second Embodiment

A method, for fabricating semiconductor modules, according to a second embodiment differs from that according to the first embodiment in the structure and the formation method of the electrodes 32 and the method for connecting the electrodes 32 to the device electrodes 12. A description is hereinbelow given of the second embodiment. Note that the same components as those of the first embodiment are given the same reference numerals and the explanation thereof is omitted as appropriate.

FIGS. 7A to 7C and FIGS. 8A to 8C are cross-sectional views showing a process in a method, for forming a wiring layer and electrodes and connecting electrodes to device electrodes, in a semiconductor module fabrication method according to the second embodiment.

Figure 7A:
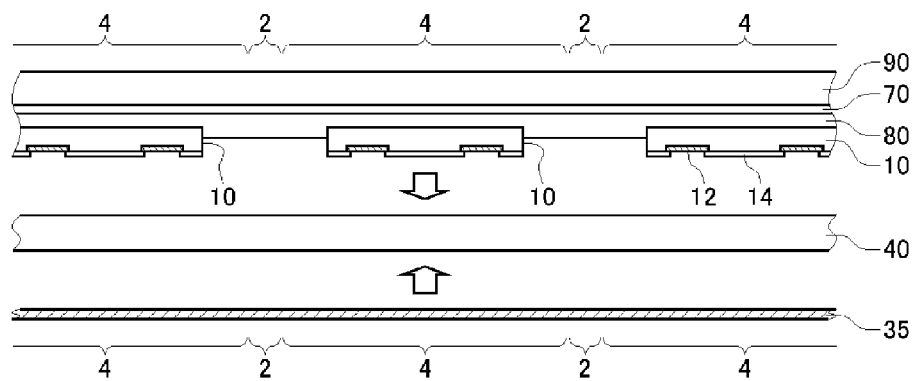
FIGS. 7A to 7C are cross-sectional views showing a process in a method, for forming a wiring layer and electrodes and connecting electrodes to device electrodes, in a semiconductor module fabrication method according to a second embodiment.

As illustrated in FIG. 7A, a copper sheet 35, as a metallic sheet, and a plurality of semiconductor devices 10 fixed to a flat sheet 90 are first press-bonded together with a third insulating resin layer 40 interposed therebetween.

Figure 7B:
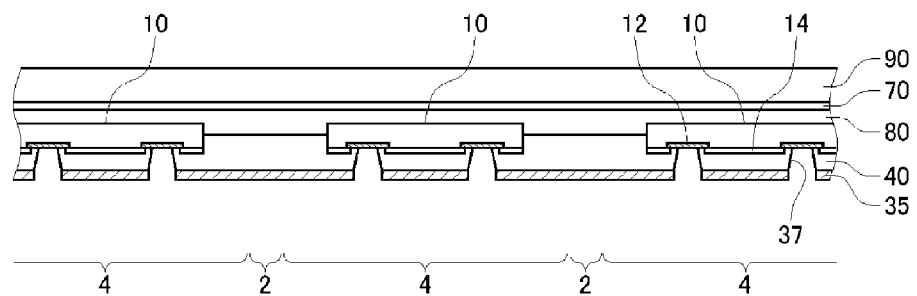

Then, as illustrated in FIG. 7B, the copper sheet 35 is selectively removed in alignment with a pattern of electrodes 32 using a photolithography method. Then, for example, a laser is directed toward removal places on the copper sheet 35; part of the third insulating resin layer 40 is selectively removed until the device electrodes 12 are exposed. As a result, a plurality of via holes 37 are formed. The laser irradiation here may use carbon dioxide laser, for instance.

Figure 7C:
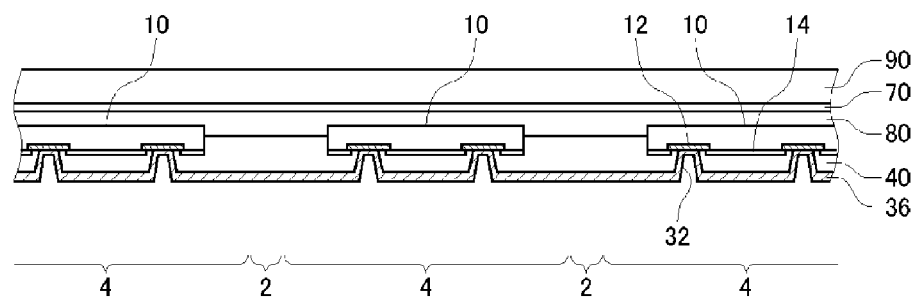

Then, as illustrated in FIG. 7C, a metal such as copper (Cu) is plated onto the surface of the copper sheet 35 and the via holes 37, by the use of an electroless plating method and an electrolytic plating method or by the use of an electroless plating method only, so that the copper sheet 35 can be electrically connected to the device electrodes 12. As a result, a conductive layer 36 is formed. Of the conductive layer 36, a portion formed within the via hole 37 constitutes the electrode 32, whereas the remaining portions constitute the copper sheet. Thus, the electrodes 32 in the second embodiment are via electrodes. The conductive layer 36 and the device electrode 12 become conductive to each other with the electrode 32 interposed therebetween. Note that the interface between the copper sheet 35 and the plated metal is not shown in FIG. 7C. By employing such a method according to the second embodiment, a plurality of semiconductor devices 10 fixed to the flat sheet 90 with the second insulating resin layer 80 interposed therebetween, the third insulating resin layer 40, and the copper sheet of the conductive layer 36 are stacked in this order. This forms a laminated body having the electrodes 32 used to electrically connect the device electrodes 12 to the copper sheet of the conductive layer 36.

Figure 8A:
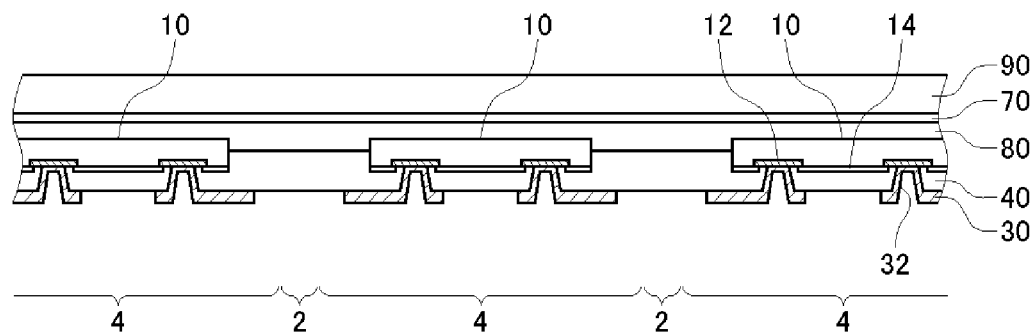
FIGS. 8A to 8C are cross-sectional views showing a process in a method, for forming a wiring layer and electrodes and connecting electrodes to device electrodes, in a semiconductor module fabrication method according to a second embodiment.

Then, not-shown resists of a predetermined pattern are formed selectively on the main surface of the conductive layer 36 opposite to a side where the conductive layer 36 is in contact with the third insulating resin layer 40, using the photolithography method. Then the conductive layer 36 is selectively removed by performing a wet etching or the like thereon using these resists as a mask. As illustrated in FIG. 8A, this forms the wirings layers 30 of a predetermined pattern corresponding to the respective semiconductor devices 10. After that, the resists are removed.

Figure 8B:
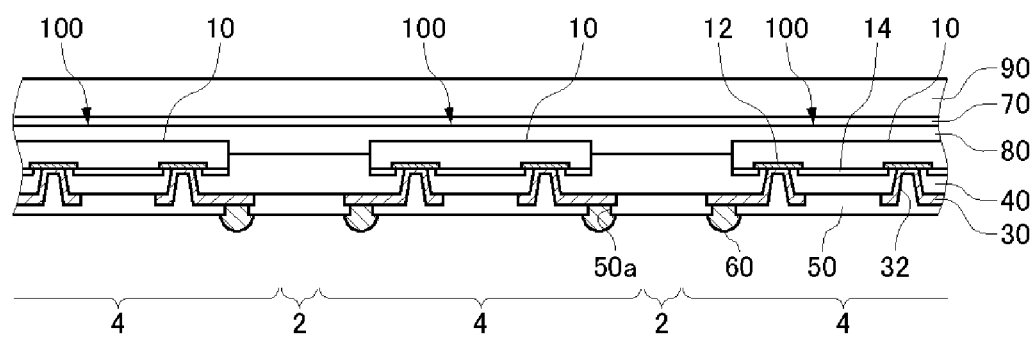

Then, as illustrated in FIG. 8B, a protective layer 50, which has openings 50a in predetermined regions, is stacked on the third insulating resin layer 40 in such a manner as to cover the wiring layers 30, using the photolithography method. Then the external connection electrodes 60 are formed within the openings 50a. Thereby, a plurality of semiconductor modules 100 joined with each other by the flat sheet 90, the second insulating resin layer 80, the third insulating resin layer 40 and the protective layer 50 are formed.

Figure 8C:
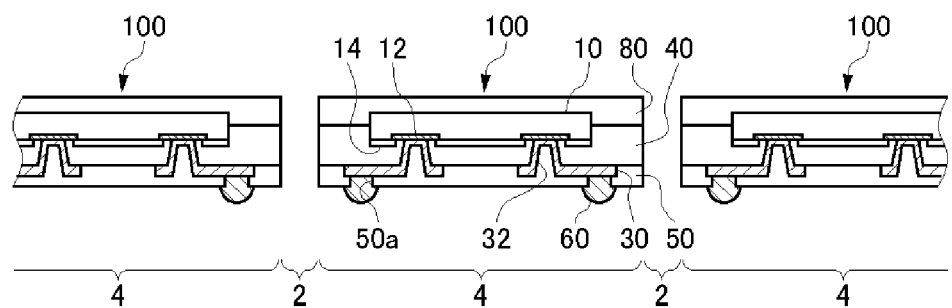

Then, as illustrated in FIG. 8C, the laminated body is diced along the scribe lines 2. The flat sheet 90 is removed from the second insulating resin layer 80 of each semiconductor module 100. As a result, a plurality of semiconductor modules 100 are completely separated from each other. The semiconductor modules 100 are manufactured through processes as described above.

In the above-described second embodiment, the electrode 32 is a via electrode. In such a case, too, the same advantageous effects as those of the first embodiment can be achieved. Also, in the second embodiment, the electrodes 32 and the device electrodes 12 are not press-bonded when the electrode 32 and the device electrode 12 are connected to each other, so that the possibility of damaging the device electrodes 12 and the semiconductor device 10 can be reduced.

Third Embodiment

A method, for fabricating semiconductor modules, according to a third embodiment differs from that according to the first embodiment in the structure and the formation method of the electrodes 32 and the method for connecting the electrodes 32 to the device electrodes 12. A description is hereinbelow given of the third embodiment. Note that the same components as those of the first embodiment are given the same reference numerals and the explanation thereof is omitted as appropriate.

FIGS. 9A to 9E are cross-sectional views showing a process in a method, for forming a wiring layer and connecting electrodes to device electrodes, in a semiconductor module fabrication method according to the third embodiment.

Figure 9A:
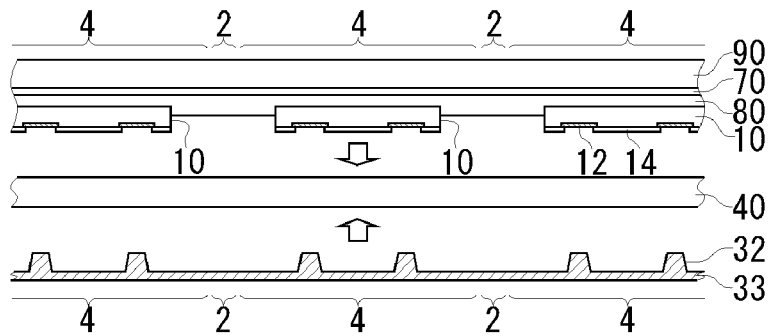
FIGS. 9A to 9E are cross-sectional views showing a process in a method, for forming a wiring layer and connecting electrodes to device electrodes, in a semiconductor module fabrication method according to a third embodiment.

Through the processes as illustrated in FIGS. 4A to 4C, a copper sheet 33 where electrodes 32 are formed is first prepared. Then, similar to the process as illustrated in FIG. 4F, the copper sheet 33 is turned into thin film so that the thickness of copper sheet 33 is equal to the that of the wiring layer 30. The electrodes 32 in the third embodiment are bump electrodes. Subsequently, as illustrated in FIG. 9A, the copper sheet 33 is positioned on one main surface side of the third insulating resin layer 40 such that the electrodes 32 face the third insulating resin layer 40. A plurality of semiconductor devices 10 fixed to the flat sheet 90 with the second insulating resin layer 80 disposed therebetween are positioned on the other main surface side of the third insulating resin layer 40. Then the copper sheet 33 and the semiconductor devices 10 are press-bonded together with the second insulating resin layer 40 interposed therebetween, using a press machine. The pressure and temperature to be employed in the press-forming are about 5 MPa and about 200° C., respectively.

Figure 9B:
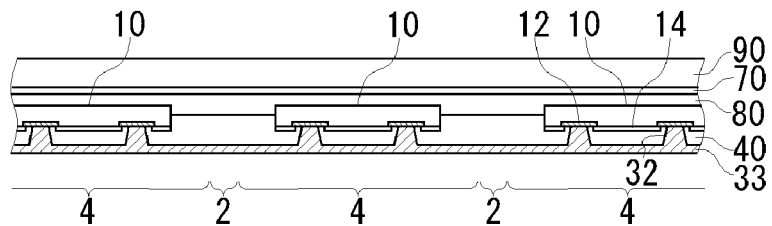

As the third insulating resin layer 40 develops plastic flow in the press-forming, the electrodes 32 penetrate the third insulating resin layer 40. Then, as illustrated in FIG. 9B, a plurality of semiconductor devices 10, the third insulating resin layer 40 and the copper sheet 33, are integrated into a single block with the result that the electrodes 32 and the device electrodes 12 are electrically coupled with each other. By employing such a method according to the third embodiment, a plurality of semiconductor devices 10 fixed to the flat sheet 90 with the second insulating resin layer 80 interposed therebetween, the third insulating resin layer 40, and the copper sheet 33 are stacked in this order. This forms a laminated body having the electrodes 32 used to electrically connect the device electrodes 12 to the copper sheet 33.

The electrodes 32 penetrate the third insulating resin layer 40 smoothly because the side surfaces of the electrodes 32 are shaped with the diameter being smaller toward the head thereof. Also, a material that develops plastic flow when pressured is used for the third insulating resin layer 40. As a result, the probability that a residual film of third insulating resin layer 40 will stay on at an interface between the electrode 32 and the device electrode 12 in the laminated body is suppressed and the connection reliability therebetween improves.

Figure 9C:
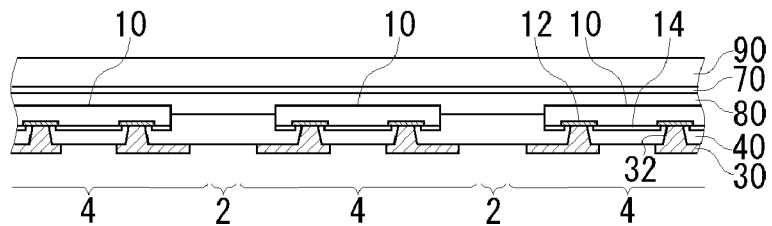

Then, not-shown resists of a predetermined pattern are formed selectively on the main surface of the copper sheet 33 opposite to third insulating resin layer 40, using the photolithography method. Then the copper sheet 33 is selectively removed by performing a wet etching or the like thereon using these resists as a mask. As illustrated in FIG. 9C, this forms the wirings layers 30 of a predetermined pattern corresponding to the respective semiconductor devices 10. After that, the resists are removed.

Figure 9D:
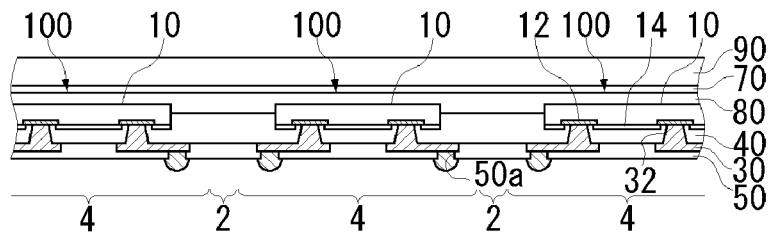

Then, as illustrated in FIG. 9D, a protective layer 50, which has openings 50a in predetermined regions, is stacked on the third insulating resin layer 40 in such a manner as to cover the wiring layers 30, using the photolithography method. Then the external connection electrodes 60 are formed within the openings 50a. Thereby, a plurality of semiconductor modules 100 joined with each other by the flat sheet 90, the second insulating resin layer 80, the third insulating resin layer 40 and the protective layer 50 are formed.

Figure 9E:
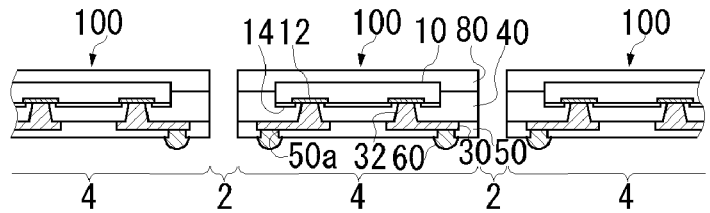

Then, as illustrated in FIG. 9E, the laminated body is diced along the scribe lines 2. The flat sheet 90 is removed from the second insulating resin layer 80 of each semiconductor module 100. As a result, a plurality of semiconductor modules 100 are completely separated from each other. The semiconductor modules 100 are manufactured through processes as described above.

In the above-described third embodiment, the copper sheet 33, the third insulating resin layer 40 and the semiconductor devices 10 are press-bonded so as to be integrally formed with each other. In so doing, the electrode 32 and the device electrode 12 are electrically coupled with each other by entering the electrode 32 into the third insulating resin layer 40. In such a case, too, the same advantageous effects as those of the first embodiment can be achieved. Also, in the third embodiment, the copper sheet 33, the third insulating resin layer 40 and the semiconductor devices 10 are press-bonded so as to be integrated into a single block, so that the fabrication process can be simplified.

Fourth Embodiment

Next, a description will be given of a mobile apparatus (portable device) provided with a semiconductor module according to the above-described embodiments. The mobile apparatus presented as an example herein is a mobile phone, but it may be any electronic apparatus, such as a personal digital assistant (PDA), a digital video cameras (DVC) or a digital still camera (DSC).

Figure 10:
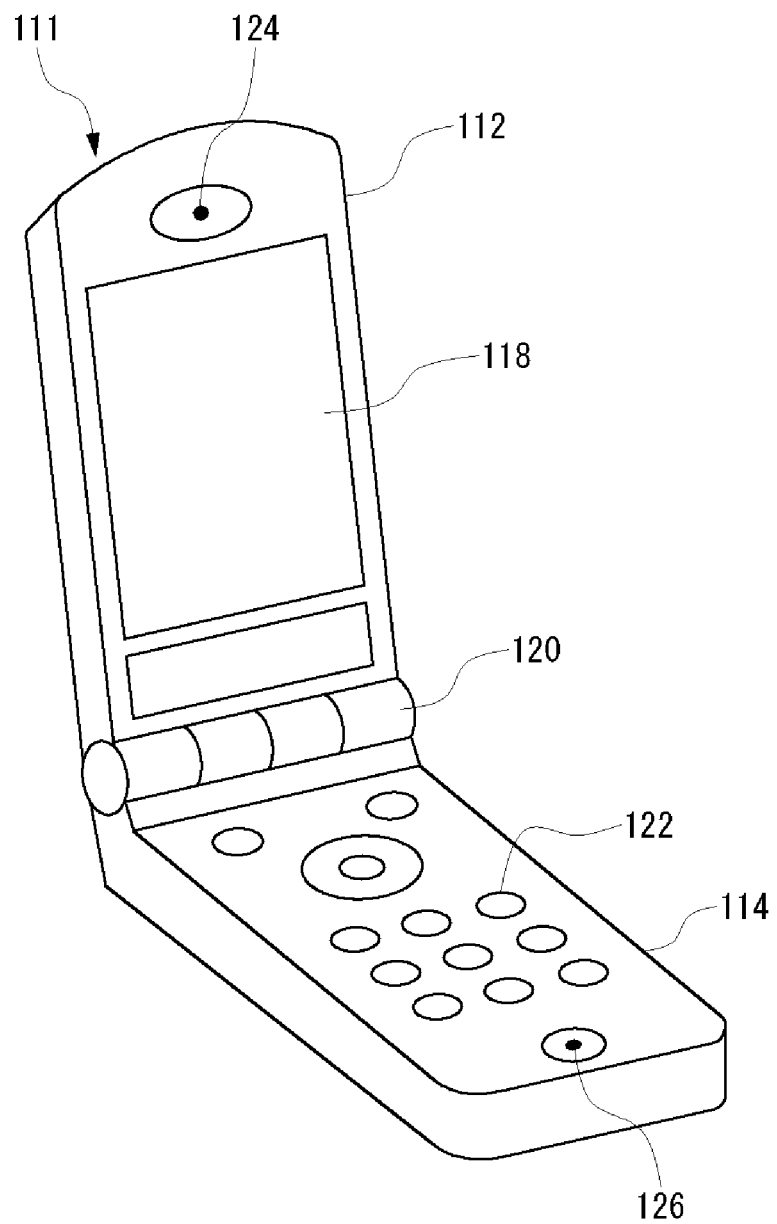
FIG. 10 illustrates a structure of a mobile phone according to a fourth embodiment.

FIG. 10 illustrates a structure of a mobile phone provided with a semiconductor module 100 according to each of the above-described embodiments of the present invention. A mobile phone 111 has a structure of a first casing 112 and a second casing 114 jointed together by a movable part 120. The first casing 112 and the second casing 114 are turnable around the movable part 120 as the axis. The first casing 112 is provided with a display unit 118 for displaying characters, images and other information and a speaker unit 124. The second casing 114 is provided with a control module 122 with operation buttons and a microphone 126. Note that a semiconductor module according to each embodiment of the present invention is mounted within a mobile phone 111 such as this.

Figure 11:
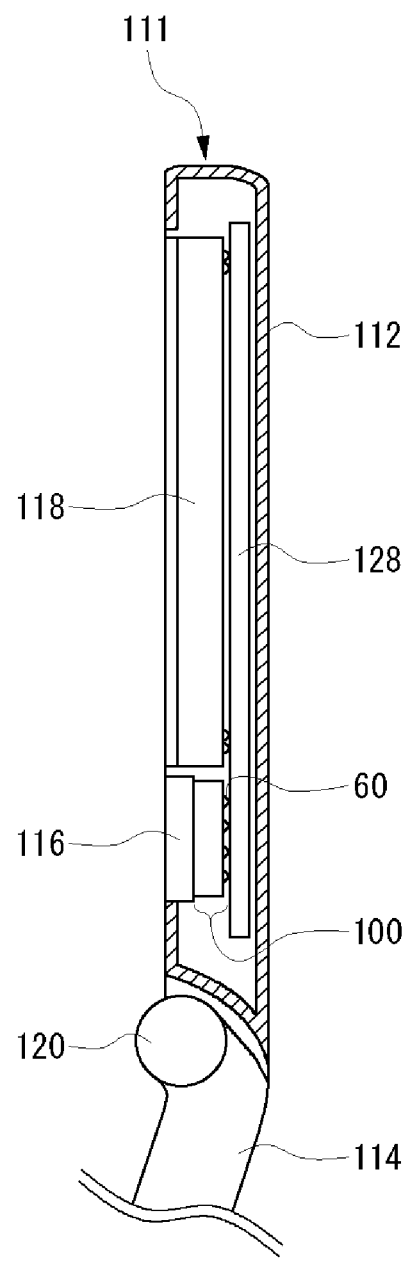
FIG. 11 is a partially schematic cross-sectional view of a mobile phone.

FIG. 11 is a partially schematic cross-sectional view (cross-sectional view of the first casing 112) of the mobile phone shown in FIG. 10. A semiconductor module 100 according to any of the embodiments of the present invention is mounted on a printed circuit board 128 via the external connection electrodes 60 and is coupled electrically to the display unit 118 and the like by way of the printed circuit board 1128. Also, a radiating substrate 116, which may be a metallic substrate or the like, is provided on the back side of the semiconductor module 100 (opposite side of the external connection electrodes 60), so that the heat generated from the semiconductor module 100, for example, can be efficiently released outside the first casing 112 without getting trapped therein.

By employing the semiconductor module 100 according to the embodiments of the present invention, the production efficiency of semiconductor modules 100 improves and the manufacturing cost thereof are reduced. Thus the manufacturing cost as to a portable device, according to the present embodiment, provided with such a semiconductor module 100 is reduced.

The present invention is not limited to the above-described embodiments only. It is understood that various modifications such as changes in design may be made based on the knowledge of those skilled in the art, and the embodiments added with such modifications are also within the scope of the present invention.

In each of the above-described embodiments, the flat sheet 90 is removed from the second insulating resin layer 80 by removing the fourth insulating resin layer 70 using solvent. In a modification, for example, the flat sheet 90 may be removed as follows. That is, at least part of the fourth insulating resin layer 70 may be thermally hardened, thereby removing the flat sheet 90.

Also, the fourth insulating resin layer 70 may be one that contains a light curable resin by light irradiation. An example of such light curable resin is an ultra-violet curable resin or the like. In this case, the fourth insulating resin layer 70 is irradiated with light through the flat sheet 90 which is a glass sheet. As a result, at least part of the fourth insulating resin layer 70 is hardened and therefore the adhesion power of the fourth insulating resin layer 70 drops. Hence, the fourth insulating resin layer 70 can be more reliably hardened by employing a simple method and therefore the flat plate 90 can be easily removed. It should be noted here that, in order to light-cure the fourth insulating resin layer 70, the flat plate 90 may be made of material other than glass so long as it has translucency. To effectively prevent the separation between the above-described semiconductor devices 10 and the second insulating resin layer 80, glass is preferred as the material having translucency.

Also, if, as described above, the fourth insulating resin layer 70 is to be thermally hardened, the flat sheet may be made of a material, having no translucency, other than glass. In such a case, the freedom of choice regarding materials used for the flat sheet 90 increases, so that the manufacturing cost can be reduced.

Also, a flat sheet 90 where a double-sided adhesive tape is applied to one main surface of the flat sheet 90 may be prepared, and the semiconductor devices 10 may be fixed to the flat sheet 90 using the double-sided adhesive tape. The double-sided adhesive tape itself may function as the second insulating resin layer 80.

Alternatively, the arrangement may be such that the third insulating resin layer 40 is stacked on one main surface of the semiconductor device 10 opposite to the side thereof in contact with the double-sided adhesion tape, then the double-sided adhesive tape is removed and the second insulating resin layer 80 is stacked thereon. In such cases, the interface between the third insulating resin layer 40 and the second insulating resin layer 80 is not the side surface of the semiconductor 10 but is positioned on approximately the same surface as the other main surface $S_{12}$ of the semiconductor device 10.

In each of the above-described embodiments, the wiring layer has a single layer. However, this should not be considered as limiting and the wiring layer may be multilayered. In each of the above-described embodiments, after the third insulating resin layer 40, the second insulating resin layer 80 and the protective layer 50 have been cut, the flat sheet 90 is removed and then a plurality of semiconductor modules 100 are completely separated from each other. However, the process may be such that the flat sheet 90 is removed and then each layer is cut with the result that a plurality of semiconductor modules 100 are completely separated from each other.

Also, for example, the following methods (1) to (7) are encompassed by the embodiments of the present invention:

(1) A method for fabricating a semiconductor module, the method including:

a process for bonding a semiconductor substrate onto a first insulating resin layer having an expansibility in a manner such that one main surface of the semiconductor substrate is in contact with the first insulating resin layer, the semiconductor substrate having a plurality of semiconductor devices formed therein, each of the semiconductor devices having device electrodes provided on the one main surface thereof;

a process for dicing the semiconductor substrate into a plurality of individual semiconductor devices;

a process for widening spacings between every adjacent semiconductor devices by expanding the first insulating resin layer in a biaxially stretched manner;

a process for placing a second insulating resin layer and a flat sheet at a side of the other main surface of the plurality of semiconductor devices, fixing the plurality of semiconductor devices to the flat sheet with the second insulating resin layer held between the plurality of semiconductor devices and the flat sheet, and removing the first insulating resin layer, while the first insulating resin layer is being expanded;

a process for stacking the plurality of semiconductor devices fixed to the flat sheet with the second insulating resin layer held therebetween, a third insulating resin layer, and a metallic plate, in this order, so as to form a laminated body having electrodes by which to electrically connect the device electrodes of each of the semiconductor devices to the metallic plate;

a process for forming a wiring layer corresponding to each of the semiconductor devices by selectively removing the metallic plate, and forming a plurality of semiconductor modules joined with each other by the flat sheet, the second insulating resin layer and the third insulating resin layer; and a process for separating the semiconductor modules into individual units by cutting the second insulating resin layer and the third insulating resin layer and removing the flat sheet from the second insulating resin layer in random order.

(2) A method, for fabricating a semiconductor module, according to the method (1), in which, in the process for forming the laminated body, the laminated body is formed such that the third insulating resin layer is stacked on the metallic sheet where bump electrodes are provided as the electrodes, and the heads of the bump electrodes are exposed from the third insulating resin layer, and the bump electrodes and the device electrodes are electrically connected to each other by bonding together the plurality of semiconductor devices, fixed to the flat sheet with the second insulating resin layer held therebetween, and the metallic sheet.

(3) A method, for fabricating a semiconductor module, according to the method (1), in which, in the process for forming the laminated body, the laminated body is formed such that the plurality of semiconductor devices, fixed to the flat sheet with the second insulating resin layer held therebetween, and the metallic sheet are press-bonded to each other with the third insulating resin layer held between the plurality of semiconductor devices and the metallic sheet, and a plurality of via holes are formed by selectively removing the metallic sheet and the third insulating resin layer, and via electrodes are formed as the electrodes in the via holes so that the via electrodes electrically connect to the device electrodes.

(4) A method, for fabricating a semiconductor module, according to the method (1), in which, in the process for forming the laminated body, the laminated body is formed such that the metallic plate, where bump electrodes are provided as the electrodes, and the plurality of semiconductor devices fixed to the flat sheet with the second insulating resin layer held therebetween are press-bonded to each other with the third insulating resin layer held between the bump electrodes and the plurality of semiconductor devices, and the bump electrodes and the device electrodes are electrically connect to each other by having the bump electrodes penetrate the third insulating resin layer.

(5) A method, for fabricating a semiconductor module, according to any of the methods (1) to (4), in which the flat sheet and the second insulating resin layer are bonded to each other with a fourth insulating resin layer, having an exfoliation function, held between the flat sheet and the second insulating resin layer.

(6) A method, for fabricating a semiconductor module, according to the method (5), in which the fourth insulating resin layer contains a light curable resin, and the flat sheet has translucency, the method further including a process for hardening the fourth insulating resin layer, for the purpose of removing the flat sheet from the second insulating resin layer, in a manner such that the fourth insulating resin layer is irradiated with light through the flat sheet.

(7) A method, for fabricating a semiconductor module, according to any of the methods (1) to (6), in which the flat sheet is a glass sheet.

What is claimed is:

1. A method for fabricating a semiconductor module, the method comprising:

bonding a semiconductor substrate onto a first insulating resin layer having an expansibility in a manner such that one main surface of the semiconductor substrate is in contact with the first insulating resin layer, the semiconductor substrate having a plurality of semiconductor devices formed therein, each of the semiconductor devices having device electrodes provided on the one main surface thereof;

dicing the semiconductor substrate into a plurality of individual semiconductor devices;

widening spaces between adjacent semiconductor devices by expanding the first insulating resin layer in a biaxially stretched manner;

placing a second insulating resin layer and a flat sheet at a side of the other main surface of the plurality of semiconductor devices, fixing the plurality of semiconductor devices to the flat sheet with the second insulating resin layer held between the plurality of semiconductor devices and the flat sheet, and removing the first insulating resin layer, while the first insulating resin layer is being expanded;

stacking the plurality of semiconductor devices fixed to the flat sheet with the second insulating resin layer held therebetween, a third insulating resin layer, and a metallic sheet, in this order, so as to form a laminated body having electrodes by which to electrically connect the device electrodes of each of the semiconductor devices to the metallic sheet;

forming a wiring layer corresponding to each of the semiconductor devices by selectively removing the metallic sheet, and forming a plurality of semiconductor modules joined with each other by the flat sheet, the second insulating resin layer and the third insulating resin layer; and separating the semiconductor modules into individual units by cutting the second insulating resin layer and the third insulating resin layer and removing the flat sheet from the second insulating resin layer in random order, wherein the flat sheet and the second insulating resin layer are bonded to each other with a fourth insulating resin layer, having an exfoliation function, held between the flat sheet and the second insulating resin layer.

2. A method, for fabricating a semiconductor module, according to claim 1, wherein the fourth insulating resin layer contains a light curable resin, and wherein the flat sheet has translucency, the method further including hardening the fourth insulating resin layer, for the purpose of removing the flat sheet from the second insulating resin layer, in a manner such that the fourth insulating resin layer is irradiated with light through the flat sheet.

\* \* \* \* \*